US008198168B2

(12) United States Patent
Tanioku (10) Patent No.: US 8,198,168 B2
(45) Date of Patent: Jun. 12, 2012

(54) METHOD OF MANUFACTURING CAPACITIVE INSULATING FILM FOR CAPACITOR

(75) Inventor: Masami Tanioku, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 12/752,456

(22) Filed: Apr. 1, 2010

(65) Prior Publication Data

US 2010/0255652 A1 Oct. 7, 2010

(30) Foreign Application Priority Data

Apr. 1, 2009 (JP) ................................. 2009-088951
Jan. 19, 2010 (JP) ................................. 2010-009000

(51) Int. Cl.
*H01L 21/20* (2006.01)
*H01L 21/44* (2006.01)
*H01L 21/31* (2006.01)

(52) U.S. Cl. ......... 438/381; 438/674; 438/685; 438/785

(58) Field of Classification Search ................... None
See application file for complete search history.

(56) References Cited

U.S. PATENT DOCUMENTS

| 3,421,195 | A | * | 1/1969 | Berryhill | 29/25.42 |
| 3,650,815 | A | * | 3/1972 | Ghoshtagore et al. | 427/126.2 |
| 4,200,474 | A | * | 4/1980 | Morris | 438/762 |
| 6,875,667 | B2 | * | 4/2005 | Iizuka et al. | 438/381 |
| 2008/0087890 | A1 | * | 4/2008 | Ahn et al. | 257/43 |
| 2009/0057738 | A1 | * | 3/2009 | Hirota et al. | 257/296 |
| 2009/0065896 | A1 | * | 3/2009 | Hwang | 257/532 |
| 2009/0289327 | A1 | * | 11/2009 | Fujiwara | 257/532 |
| 2009/0311521 | A1 | * | 12/2009 | Nikolov et al. | 428/336 |
| 2010/0330269 | A1 | * | 12/2010 | Chen et al. | 427/123 |
| 2010/0330772 | A1 | * | 12/2010 | Rui et al. | 438/396 |

FOREIGN PATENT DOCUMENTS

| JP | 2000-254519 | 9/2000 |
| JP | 2007-110111 | 4/2007 |

OTHER PUBLICATIONS

Lim et al., "Characteristics of TiOx films prepared by chemical vapor deposition using tetrakis-dimethyl-amino-titaniuim and water", Thin Solid Films 498 (2006) 254-258.

* cited by examiner

*Primary Examiner* — Scott B Geyer
(74) *Attorney, Agent, or Firm* — Young & Thompson

(57) ABSTRACT

According to the invention, a Ti film is formed on a substrate and is annealed at the temperatures of 350° C.-400° C. under oxidative environment, so that a $TiO_2$ film having a rutile crystal structure is formed. Since the $TiO_2$ film having a rutile crystal structure has a high dielectric constant, it is useful for a capacitive insulating film for a capacitor.

12 Claims, 11 Drawing Sheets

METHOD OF MANUFACTURING CAPACITIVE INSULATING FILM FOR CAPACITOR

This application is based on Japanese Patent applications Nos. 2009-088951 and 2010-009000, the contents of which are incorporated hereinto by reference.

BACKGROUND OF THE INVENTION

1. Field of the Invention

The present invention relates to a method of manufacturing a capacitive insulating film for a capacitor, and more particularly, to a method of forming a $TiO_2$ film having a rutile crystal structure at low temperatures of 400° C. or less.

2. Description of the Related Art

As a semiconductor device such as DRAM device is finer, an insulating film for a capacitor having a high dielectric constant (capacitive insulating film) is needed.

As insulating material for a capacitor having a high dielectric constant, $TiO_2$ (titanium oxide) may be exemplified. There are two types of crystal structures, i.e., anatase and rutile types in $TiO_2$, which are well-known. The anatase crystal is a low temperature phase that is apt to be formed at low temperatures and has a low relative dielectric constant of about 40 or less. In the meantime, the rutile crystal is a high temperature phase that is typically formed at high temperatures and has a high relative dielectric constant of about 80 or more. In particular, when the rutile crystal is used as insulating material for a capacitor, it is possible to manufacture a high-capacity capacitor.

A $TiO_2$ film can be formed by a variety of methods such as CVD (Chemical Vapor Deposition), ALD (Atomic Layer Deposition) and the like. When the $TiO_2$ film is used for a semiconductor device, the ALD method is mainly used due to a standpoint of fining. However, when forming the $TiO_2$ film to be used for a semiconductor device, it is difficult to form a rutile crystal of a high dielectric constant at low temperatures of 400° C. or less even with any method including the ALD method.

For example, according to the experiments performed by Gyeong Teak Lim et al. (Thin Solid Films 498 (2006) p 254-258), a $TiO_2$ film is formed on silicon with the ALD method using precursor of TDMAT (tetrakis-(dimethylamino)titanium) and oxidizer of $H_2O$. The $TiO_2$ film becomes amorphous just after forming the film and is then crystallized by performing the annealing. The anatase crystals are generated with the annealing of 300° C. or more, the rutile and anatase crystals are generated at 700° C. or more and the rutile crystals become main at 800° C. or more. However, in a semiconductor process, it is difficult to perform the annealing at high temperatures, so as to avoid a bad effect on a semiconductor device such as transistor, as the device is gradually finer. Thus, it is actually impossible to perform the annealing at the high temperatures for obtaining the rutile crystals.

In addition, JP-A 2000-254519 discloses a technology of illuminating Ar ion beam so as to form a stacked structure of a rutile-type $TiO_2$ film and an anatase-type $TiO_2$ film for photocatalyst, thereby lowering a structure transition temperature from the anatase-type structure to the rutile-type structure. However, even with such means, the annealing of 500° C. or more should be performed so as to obtain a $TiO_2$ film of the rutile crystal structure. In addition, when forming the $TiO_2$ film in a location having a three-dimensional structure, such as a capacitor of a DRAM device, it is difficult to uniformly introduce the Ar ions by the ion illumination.

Additionally, JP-A 2007-110111 discloses a technology of forming a $RuO_2$ film on a surface of a lower electrode for a capacitor, which electrode is made of Ru (ruthenium), thereby obtaining the rutile-type $TiO_2$ film at low temperatures of 400° C. or less. However, since the material of the lower electrode is limited to Ru, it is difficult to change the material of the electrode and thus to form a capacitor having higher performance.

Thus, the inventors studied a method capable of forming a $TiO_2$ film of a rutile crystal structure at temperatures as low as possible and easily forming a uniform $TiO_2$ film without undergoing influences of electrode shapes and materials of a base even when it is applied to a capacitor of a three dimensional structure.

The inventors carried out an experiment of forming a $TiO_2$ film using the ALD method. However, the anatase crystals were apt to be formed in a method of directly forming a $TiO_2$ film. In addition, even when studying the annealing method, it was difficult to obtain a $TiO_2$ film having rutile crystals only.

To be more specific, the $TiO_2$ film formed at 200° C. was amorphous. When the amorphous film was crystallized with the annealing of high temperatures, both the anatase crystals and the rutile crystals were mixed. In addition, when the $TiO_2$ film was formed at 250° C. or more, the anatase crystals were generated from the beginning. The anatase crystals once formed were stable and were not extinguished even when performing the annealing treatment of high temperatures at which the rutile crystals are generated. The anatase crystals are not desirable because they lower the dielectric constant.

SUMMARY

The present invention has been made to solve the above problems occurring in the prior art. The invention provides a method of easily forming a $TiO_2$ film having a rutile crystal structure at relatively low temperatures. The means provided by the invention is to deposit a Ti film and to oxidize the Ti film with an annealing treatment under oxidative environment, thereby converting the Ti film into a $TiO_2$ film having a rutile crystal structure.

Specifically, according to an embodiment of the invention, there is provided a method of manufacturing a capacitive insulating film for a capacitor. The method comprises:
 depositing a Ti film, and
 annealing the Ti film under oxidative environment, thereby converting the Ti film into a $TiO_2$ film having a rutile crystal structure.

In addition, according to another embodiment of the invention, there is provided a method of manufacturing a semiconductor device having a capacitor. The method comprises:
 forming a lower electrode of a capacitor,
 depositing a Ti film on the lower electrode,
 annealing the Ti film under oxidative environment, thereby converting the Ti film into a $TiO_2$ film having a rutile crystal structure, and
 forming an upper electrode of the capacitor on the $TiO_2$ film.

It is possible to form a $TiO_2$ film of a rutile crystal structure having a high dielectric constant at low temperatures of 350-400° C., as a capacitive insulating film for a capacitor. As a result, it is possible to increase the capacitance of a capacitor and to avoid a bad influence of the high temperature heat treatment on a semiconductor element such as a transistor, so that it is possible to provide a fined semiconductor device of high performance.

BRIEF DESCRIPTION OF THE DRAWINGS

The above features and advantages of the present invention will be more apparent from the following description of certain preferred embodiments taken in conjunction with the accompanying drawings, in which:

FIGS. 3(A) and 3(B) are views showing analysis results on crystal structures of each manufactured sample with a XRD (X-ray diffraction) method, wherein FIG. 3(A) shows diffraction strength waveforms (vertical axis) with a horizontal axis (2θ) when the incident angle (θ) of X-ray on a sample surface is changed to 10-90 degrees and FIG. 3(B) shows an enlarged result of a range of 35-45 degrees of the horizontal axis (2θ);

FIGS. 5(A) and 5(B) are views illustrating a measurement results of the XRD method showing an effect of annealing time on annealing temperatures, wherein FIG. 5(A) is a measurement result at 400° C. and FIG. 5(B) is a measurement result of 350° C.;

DETAILED DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purpose.

{Exemplary Embodiments}

In the followings, a method of manufacturing a $TiO_2$ film according to an exemplary embodiment of the invention will be described.

Figure 1:
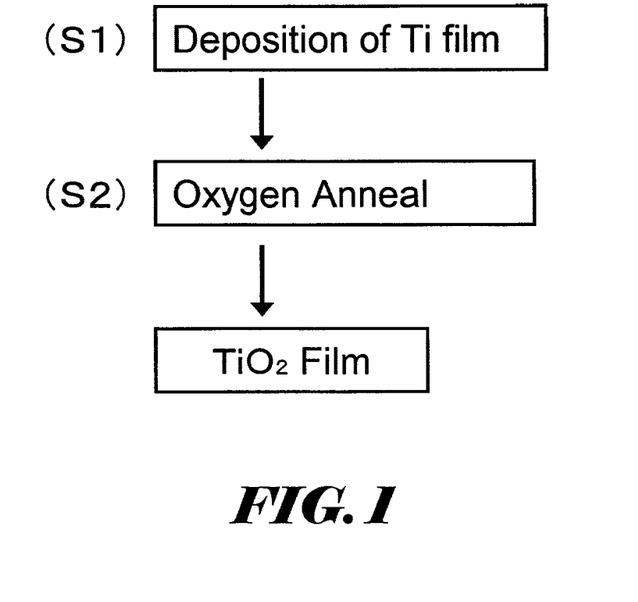
FIG. 1 is a flow chart showing a manufacturing flow of a $TiO_2$ film according to an embodiment of the invention.

In this exemplary embodiment, a $TiO_2$ film of a rutile crystal structure is formed in accordance with a process of two steps, as shown in FIG. 1.

After forming a lower electrode for a capacitor, a Ti (titanium) film is deposited (step S1). The Ti film may be deposited by a CVD method including an ALD method or sputtering method. That is, the invention is not particularly limited with respect to the method of forming the film.

When the Ti film is formed by the CVD method (or ALD method), $TiCl_4$, for example, may be formed by using, as reaction gases, source gas and reduction gas such as $H_2$, $NH_3$ or mixed gases of $N_2$ and $NH_3$. In the meantime, it is difficult to react the source gas at low temperatures and it is thus necessary to increase reactivity by plasmic reaction gases, for example. The source gas is not particularly limited as long as precursor Ti and oxygen are not directly combined. Even in this case, since the source gas is not well reacted with the reduction gas at the low temperatures, it is necessary to increase the reactivity as described above.

Next, by performing the annealing treatment under oxidative environment at temperatures of about 350-400° C., the deposited Ti is oxidized and thus converted into a $TiO_2$ film (step S2). The above temperature range is just an example and the annealing temperature is not limited to the temperature range, as described below.

Contrary to the prior art of depositing a $TiO_2$ film from the beginning, the Ti film is oxidized to form a $TiO_2$ film as described above, so that it is possible to form a $TiO_2$ film of a rutile crystal structure only with the heat treatment of low temperatures.

A crystal state of the $TiO_2$ film formed by the method of this exemplary embodiment will be described.

A sample for evaluation was manufactured as follows.

Figure 2:
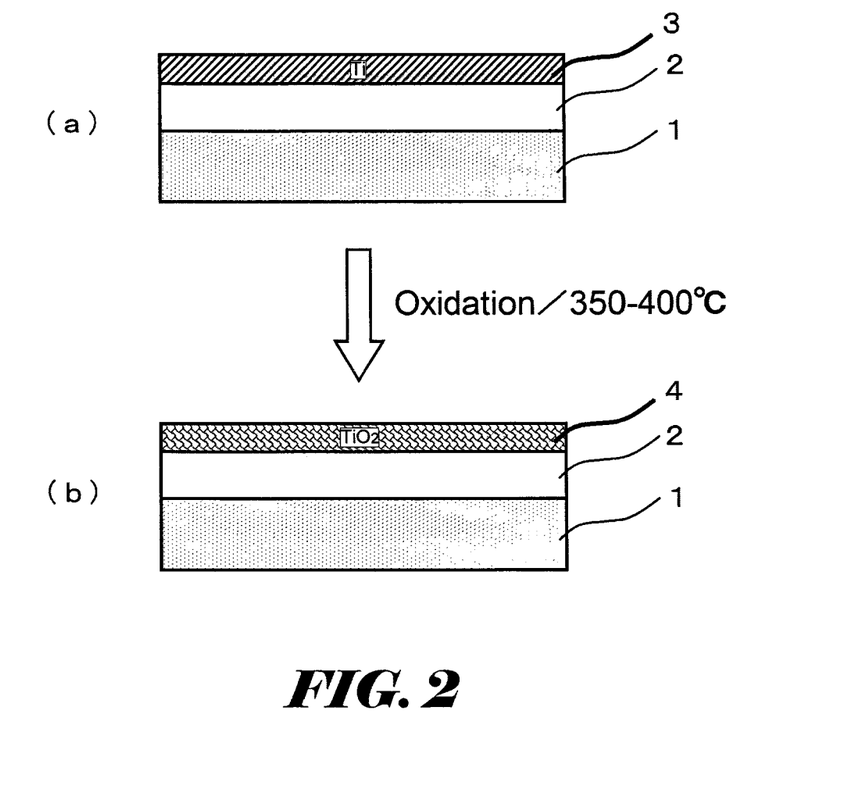
FIG. 2 is a sectional view illustrating a method of manufacturing a sample for evaluation.

First, as shown in (a) of FIG. 2, a silicon oxide film 2 was formed on a semiconductor substrate 1 and a Ti film was then formed thereon in a thickness of 20 nm. To be more specific, a sputtering method was used in which a substrate temperature was maintained at the temperature of 300° C., a chamber was maintained at the pressure of 0.5 Pa under Ar environment and a sputtering was performed to a Ti target under such state, thereby depositing a Ti film 3 on the silicon oxide film 2.

Subsequently, as shown in (b) of FIG. 2, by furnace annealing using a heat treatment furnace that supplies oxygen gas, annealing oxidization (hereinafter, the annealing under oxygen environment is referred to as oxygen annealing) was performed and the Ti film 3 was thus oxidized to form a $TiO_2$ film 4. Regarding the temperatures of the oxygen annealing, a plurality of conditions were set in a range of 300° C.-550° C. for evaluation and each oxygen annealing was performed for 10 minutes according to each temperature condition.

In the meantime, in the prior art (Gyeong Teak Lim et al.), the $TiO_2$ film is formed on silicon, so that a silicon oxide film is always formed between the silicon and the $TiO_2$ film. Thus, in order to compare the characteristics of the film at the same conditions, the $TiO_2$ film was formed on the silicon oxide. In the invention, a base is not necessarily the silicon oxide. In addition, when the invention is applied to a capacitor that is used in a general semiconductor device, it is desirable to deposit a Ti film on a metal electrode and to perform the annealing under oxidative environment. Further, the material of the electrode is not particularly limited as long as it has a characteristic of oxidation resistance.

Figure 3A:
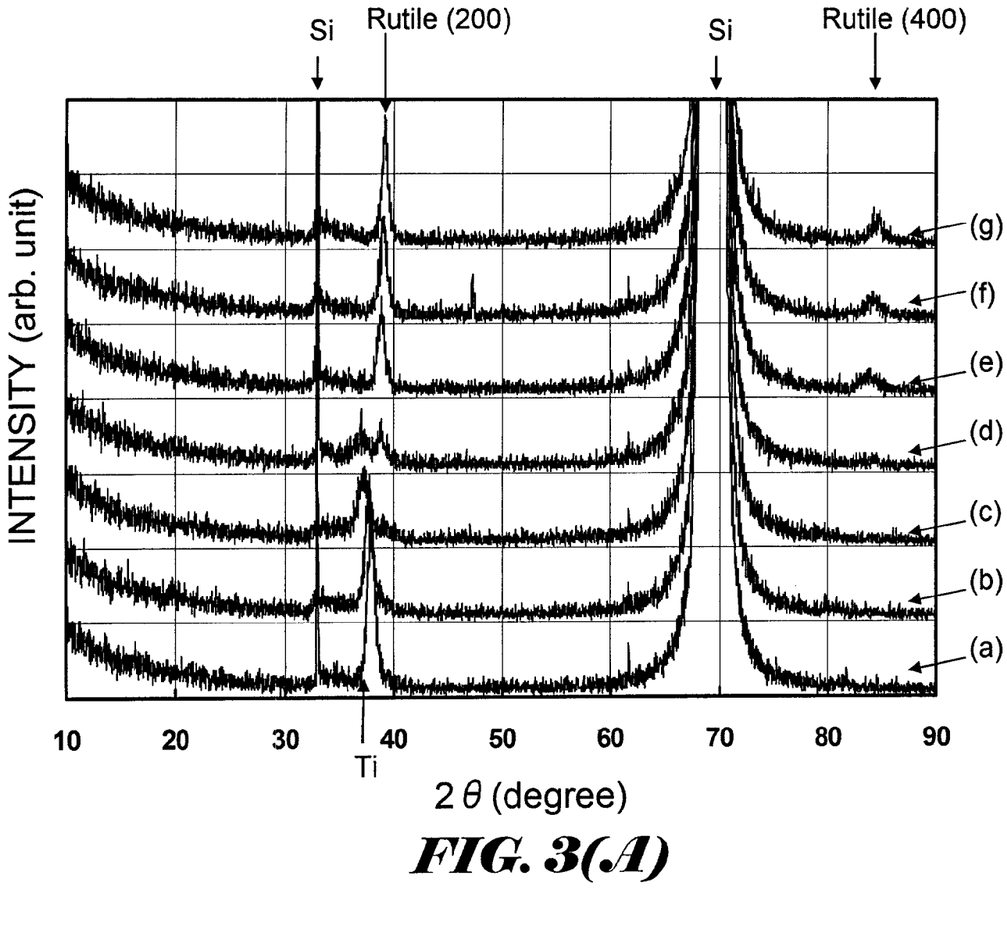

FIGS. 3(A) and 3(B) show analysis results on crystal structures of each manufactured sample. FIG. 3(A) shows diffraction strength waveforms (vertical axis) with a horizontal axis (2θ) when the incident angle (θ) of X-ray on a sample surface is changed to 10-90 degrees. The waveform of (a) is a measurement result of the sample when the oxygen annealing was not performed and the waveforms of (b) to (g) are measurement results of the sample when the temperature condition of the oxygen annealing was increased to 300° C.-550° C. by 50° C. Each measured waveform of (a) to (g) is shifted in the direction of the vertical axis while using the common horizontal axis, so as to recognize positions of strength peaks. In addition, the positions of the strength peaks are indicated with arrows. From FIG. 3(A), a strength peak peculiar to $TiO_2$ of an anatase crystal structure is not seen in each waveform (a) to (g). In other words, the $TiO_2$ film formed by the method of this exemplary embodiment (FIG. 1) does not include an anatase crystal, including a case that the oxygen annealing was performed at the temperatures of 450° C. or more.

Figure 3B:
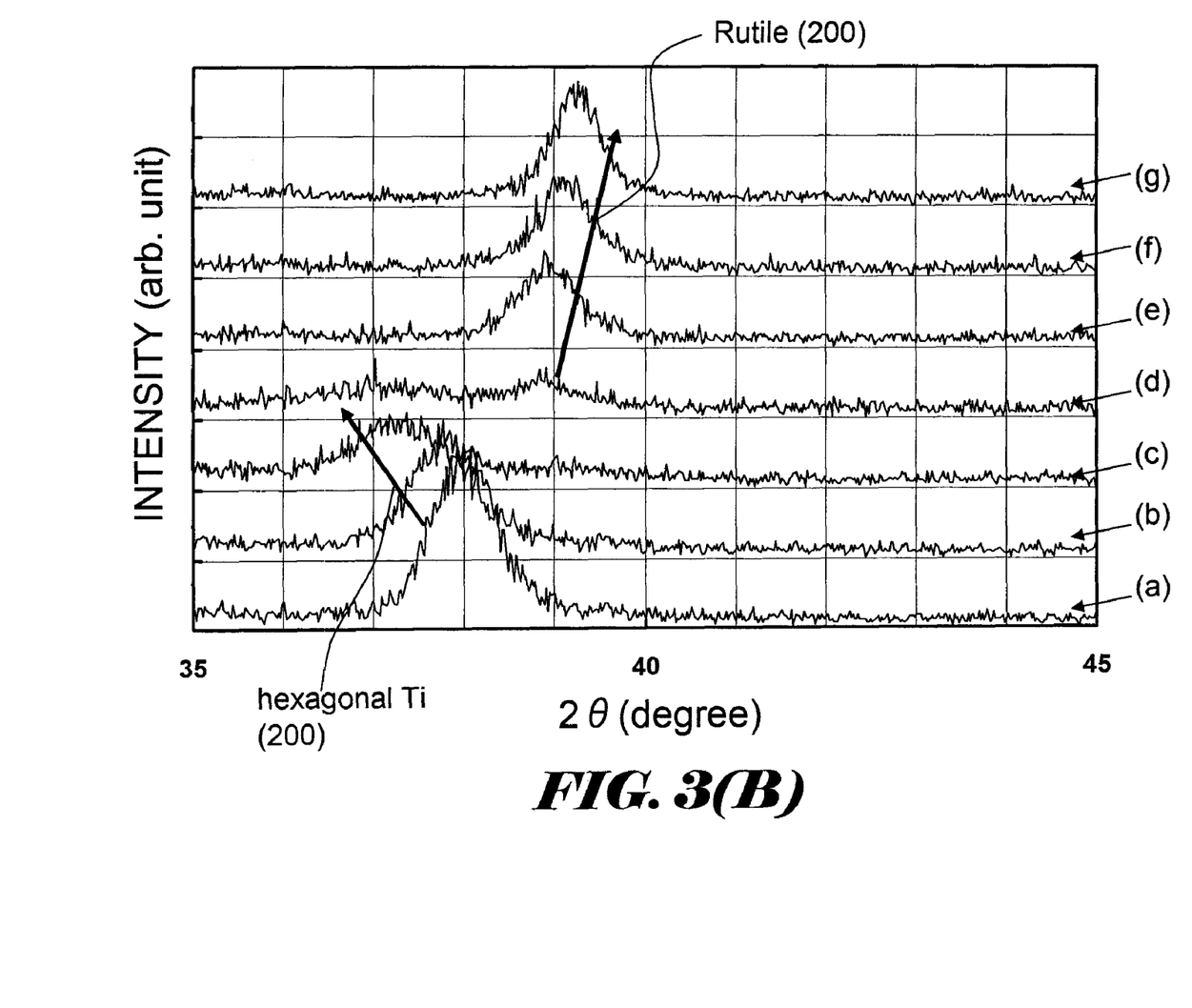

FIG. 3(B) shows an enlarged result of a range of 35-45 degrees of the horizontal axis (2θ).

In the state (a) that the oxygen annealing was not performed, a crystal peak of Ti is seen around 2θ=38°. As the temperature of the oxygen annealing is increased, the Ti peak strength is decreased and shifted in a left direction. This indicates that a lattice interval of the Ti crystal is widened because a part of the Ti crystal is oxidized to collapse the crystal structure and the oxygen is introduced into the Ti crystal. The Ti crystal exists up to the oxygen annealing (d) of 400° C. and is completely extinguished in the oxygen annealing (e) of 450° C.

Instead, a new peak appears around 2θ=39° for the oxygen annealing of 400° C. or more. The corresponding strength peak indicates a-axis (200) peak of a rutile crystal of $TiO_2$. As the annealing temperature is increased, the peak is gradually stronger, is shifted in a right direction and approaches a position (2θ=39.2 degree) of $TiO_2$ bulk crystal of the rutile structure.

Figure 4:
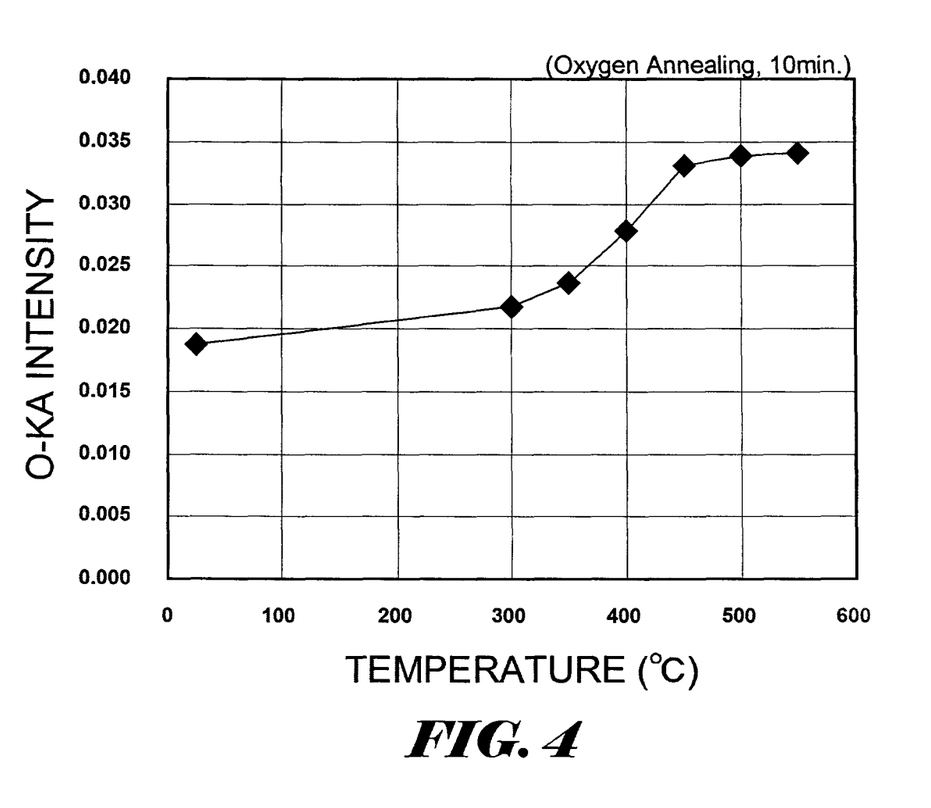
FIG. 4 is a view showing a result of oxygen strength values of each manufactured sample with a XRF (X-ray fluorescence element analysis) method, wherein a horizontal axis indicates annealing temperatures and a vertical axis indicates inherent X-ray strengths of an oxygen element.

In the followings, a measurement result of oxygen strength values of each manufactured sample with an XRF (X-ray fluorescence element analysis) method is shown in FIG. 4 wherein a horizontal axis indicates annealing temperatures and a vertical axis indicates inherent X-ray intensity of an oxygen element.

By the XRF method, it is possible to obtain peak intensity proportional to the number of atoms in a target element. A point plotted in the leftmost of FIG. 4 indicates a measurement result of the sample for which the oxygen annealing has not been performed. Even though the annealing has not been performed, the intensity is not 0 (zero) because the oxygen contained in the silicon oxide film 2 of the base is included in the measurement result. In other words, the intensity measured under state that the oxygen annealing has not been performed becomes a starting-point intensity.

When the oxygen annealing is performed, the number of atoms is increased as the annealing temperature is increased. The intensity is almost saturated around 450° C. at which the Ti peak disappears in the XRD method. This matches an aspect in which the oxidization of Ti is developed. In this exemplary embodiment, it is possible to form a $TiO_2$ film of a rutile structure even at the low temperatures of 400° C. by prolonging the oxygen annealing time.

A sample on which a Ti film was deposited as described above was prepared. In the followings, a result will be described which was obtained when the oxygen annealing time was changed while the temperature of the oxygen annealing was fixed.

Figure 5A:
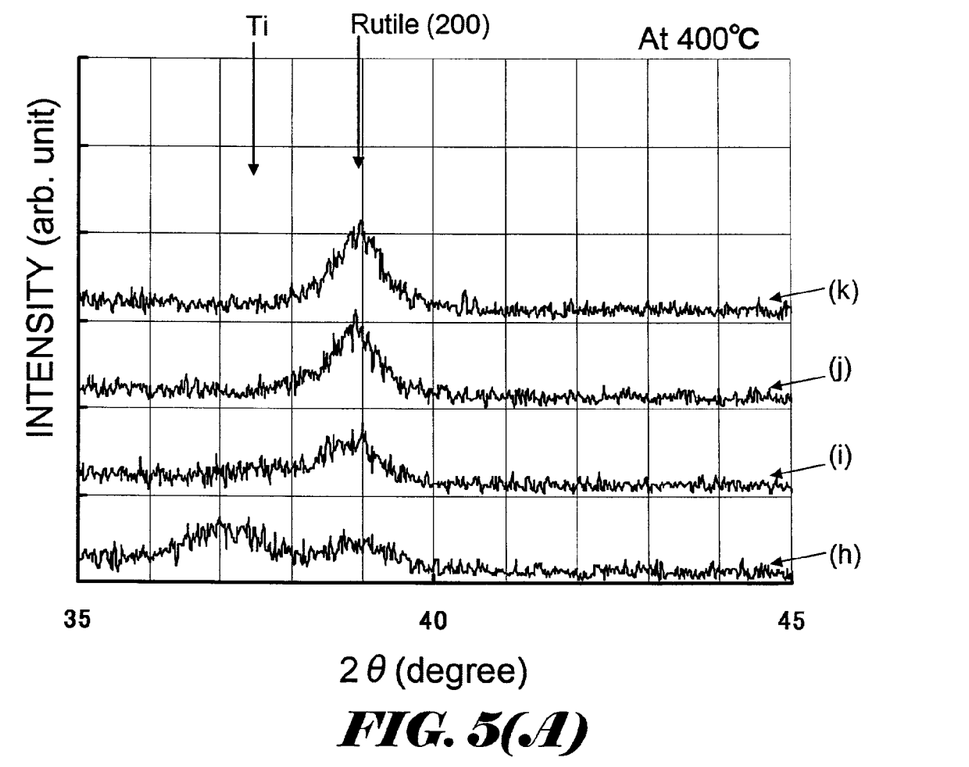

FIG. 5(A) is a measurement result of the XRD method when the temperature of the oxygen annealing was set at 400° C. and the oxygen annealing time was increased to 10-40 minutes by 10 minutes. Each waveform of (h) to (k) corresponds to each case where the oxygen annealing time was increased by 10 minutes.

Figure 5B:
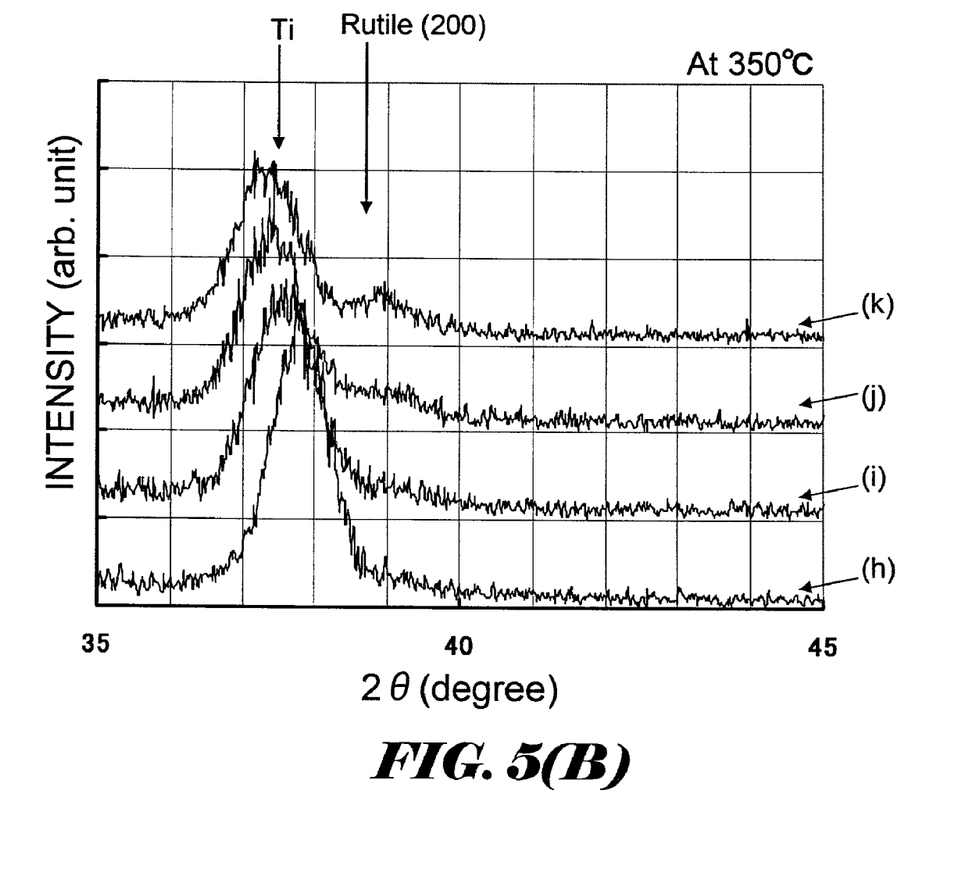

FIG. 5(B) is a measurement result of the XRD method when the temperature of the oxygen annealing was set at 350° C. and the oxygen annealing time was increased to 10-40 minutes by 10 minutes. Like FIG. 5(A), each waveform of (h) to (k) corresponds to each case where the oxygen annealing time was increased by 10 minutes.

As can be seen from FIG. 5(A), when the oxygen annealing was performed at 400° C., the Ti peak gradually disappeared and the peak of the rutile crystal was increased as the oxygen annealing time was increased. When the oxygen annealing was performed for 40 minutes, the Ti peak almost disappeared and the intensity of the rutile peak was sufficient (waveform (k)).

In addition, as can be seen from the result of FIG. 5(B), when the oxygen annealing was performed at 350° C., the Ti peak quite remained even after the oxygen annealing was performed for 40 minutes. However, some rutile peak was seen (waveform (k)). The reason is as follows: since the Ti film thickness of the prepared sample was thick, i.e., 20 nm, the Ti peak remained until all Ti was oxidized. Since the oxidization is developed from a surface of the Ti film, a part near the lower electrode has not been oxidized yet.

According to a further study, when the thickness of the Ti film was thinner, it was possible to form the $TiO_2$ film of the rutile crystal structure even with the oxygen annealing at 350° C. That is, in this exemplary embodiment, it is desirable to continue the oxidization until the Ti film is oxidized to completely change into $TiO_2$ film and to set the oxidization time in accordance with the film thickness of Ti and the temperature of the oxygen annealing.

For example, for a case where the invention is applied to a fine memory cell having a minimum processing size of 60 nm or less, it is necessary to make a film thickness of a capacitive insulating film 10 nm or less. Thus, the manufacturing method of this exemplary embodiment is very effective.

Like this, by using the manufacturing method of this exemplary embodiment, it is possible to manufacture a $TiO_2$ film having a rutile crystal only, i.e., having no anatase crystal at the low temperatures of 350° C.-400° C.

The reason to form a $TiO_2$ film of a rutile crystal structure by using the manufacturing method of this exemplary embodiment is as follows:

When Ti atoms and oxygen atoms are originally combined to form a $TiO_2$ film as the prior art, the anatase crystallization is started at the temperature range of 250-300° C., so that the anatase crystal is made. In addition, when the anatase crystal is once formed, the transformation into the rutile crystal is difficult.

However, when the Ti film is deposited from the beginning, the Ti film is still maintained under metal state at the temperature range of 250-300° C. and the oxidization is barely started at the temperatures of 300° C. or more (FIG. 4). Due to this, the Ti metal film, as it is, can pass to the temperature ranges at which the anatase crystallization is started, so that it is possible to avoid the anatase crystallization and thus to make the rutile crystal.

In the meantime, it is preferable that the Ti film to be originally formed is crystallized under deposited state. This is because it is possible to easily diffuse the oxygen and to easily oxidize the whole film under crystalline state rather than amorphous state. Thus, when depositing a Ti film, it is preferable to form the film at the temperatures (about 200-400° C.) as high as possible.

In addition, when forming a capacitor for a semiconductor device, it is preferable to form the capacitor at the temperatures as low as possible. Thus, it is preferable that the annealing temperature is 400° C. or less under oxidative environment. When forming a $TiO_2$ film under state in which the effect of heat is not particularly considered, it may be possible to perform the annealing at the temperatures above 400° C. Accordingly, it is possible to set the annealing temperature in accordance with the characteristics required for a semiconductor device to be manufactured.

Meanwhile, when performing the oxygen annealing under oxygen gas environment, it is preferable to perform the annealing at the temperatures of 350° C. or more, as described above. However, when using another oxidization method, the temperature is not particularly limited to 350° C. or more. In other words, it may be possible to perform the oxidization treatment at the temperatures of 350° C. or less as long as the deposited Ti film is oxidized to change into a rutile-type $TiO_2$ film.

In addition, when performing the annealing, the environment is not particularly limited to the oxygen gas ($O_2$ gas). That is, any environment is possible as long as it is an oxidative environment including the oxygen atoms. To be more specific, ozone ($O_3$) gas, steam ($H_2O$), nitrous oxide (NO) gas and the like can be used. In particular, when performing the oxidization at low temperatures, it is preferable to use the oxidative gas such as ozone, steam and the like because the oxidative gas can reduce the oxidization time.

In the followings, it will be described a case where the invention is applied to a capacitive insulating film of a capacitor (capacitive device) constituting a memory cell of a DRAM device, which is a specific example to which the invention is applied.

Figure 6:
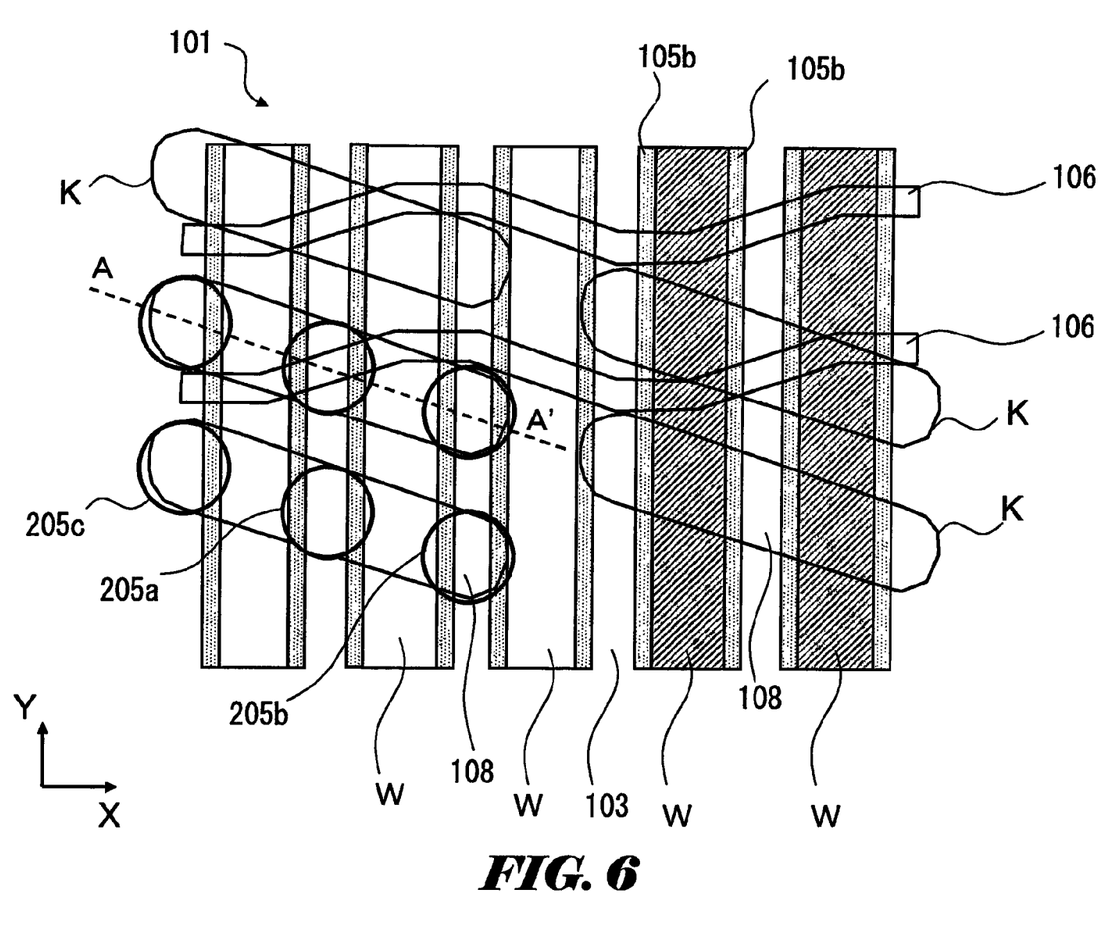
FIG. 6 shows a conceptual diagram showing a plan layout of a memory cell part of a DRAM device that is a semiconductor device according to an embodiment of the invention.

FIG. 6 shows a conceptual diagram showing a plan layout of a memory cell part of a DRAM device that is a semiconductor device to which the invention is applied. The right side of FIG. 6 is shown with a perspective sectional view based on a plane that cuts a gate electrode 5 and a side wall 5b that will be a word wiring (W), which will be described below. In addition, for simplification, a capacitor is not shown in FIG. 6 and is shown with a sectional view only.

Figure 7:
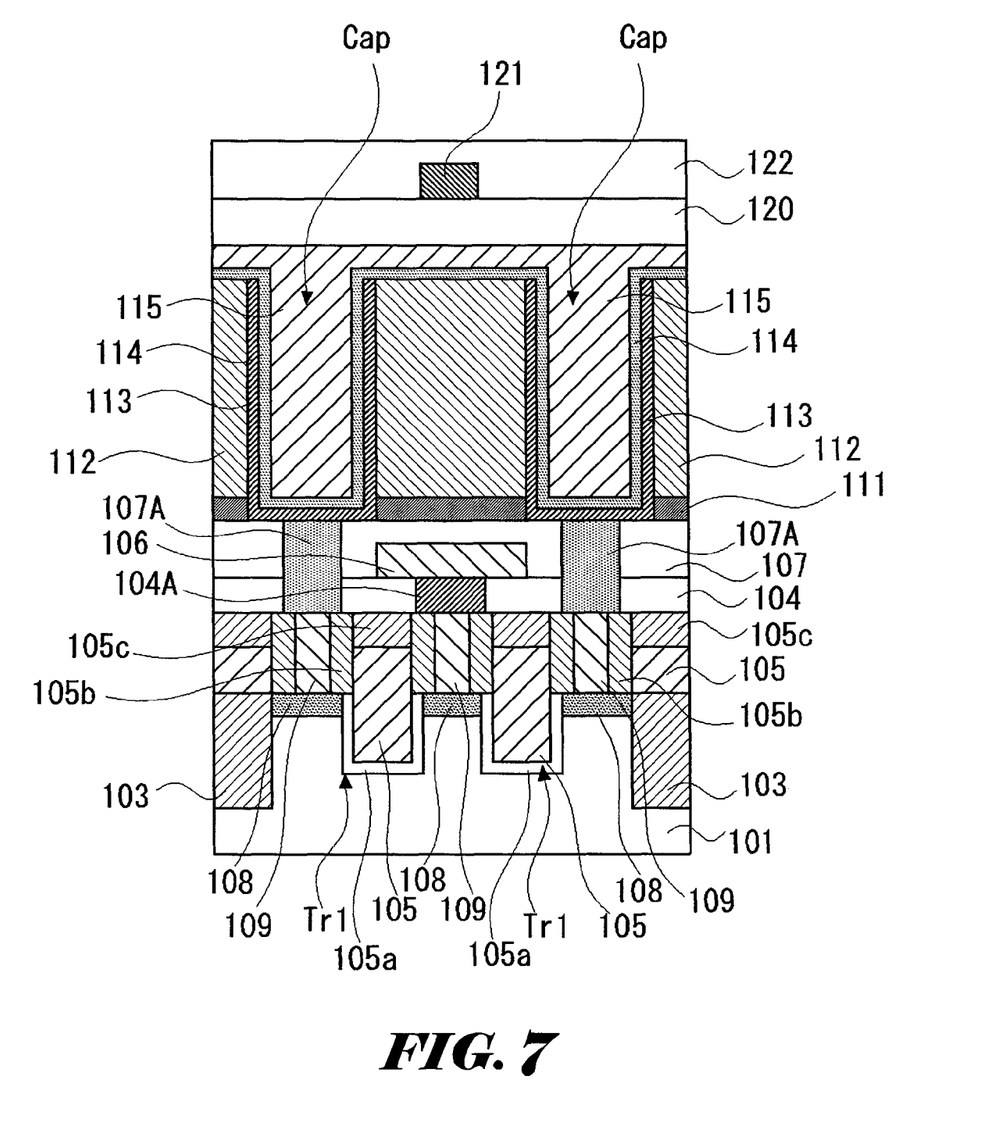
FIG. 7 is a schematic sectional view taken along a line of A-A' in FIG. 6.

FIG. 7 is a schematic sectional view taken along a line of A-A' of the memory cell part (FIG. 6). Meanwhile, the drawings are provided only to illustrate a structure of a semiconductor device and it should be understood that the dimensions or sizes of each part shown are different from those of an actual semiconductor device.

As shown in FIG. 7, the memory cell part is schematically constituted by MOS transistors (Tr1) and capacitors (Cap) connected to the MOS transistors through a plurality of contact plugs.

In FIGS. 6 and 7, a semiconductor substrate 101 is made of silicon (Si) containing p-type impurities of a predetermined concentration. The semiconductor substrate 101 is formed with element isolation regions 103. The element isolation region 103 are formed at parts except active regions (K) by embedding an insulating film such as silicon oxide film ($SiO_2$) in a surface of the semiconductor substrate 101 by a STI (Shallow Trench Isolation) method and are insulation-isolated from the neighboring active regions (K). In this exemplary embodiment, it is shown a case where the invention is applied to a cell structure in which a memory cell of 2 bits is arranged in one active region (K).

In this exemplary embodiment, as the plan structure shown in FIG. 6, a plurality of active regions (K) having a thin and long rectangular shape are aligned to be inclined in a right downward direction at a predetermined interval and arranged in accordance with a layout referred to as a $6F^2$-type memory cell.

Both ends and a central part of each active region (K) are formed with impurity diffusion layers, respectively, which function as source/drain regions of the MOS transistor (Tr1). Positions of substrate contact parts 205a, 205b, 205c are defined so that they are arranged just above the source/drain regions (impurity diffusion layers).

In FIG. 6, bit wirings 106 of a broken line shape (bent shape) are extended in a horizontal (X) direction. The bit wirings 106 are arranged at an interval in the vertical (Y) direction of FIG. 6. In addition, word wirings W of a straight line shape are arranged which are extended in the vertical (Y) direction of FIG. 6. Each of the word wirings W is arranged at a predetermined interval in the horizontal (X) direction of FIG. 6. The word wiring W is structured to include a gate electrode 105 shown in FIG. 7 in a part at which the word wiring W intersects the active region K. In this exemplary embodiment, the MOS transistor Tr1 has a gate electrode of a recess shape.

As shown in the sectional structure of FIG. 7, impurity diffusion layers 108 functioning as source/drain regions are spaced and formed in the active regions K sectioned in the element isolation regions 103 of the semiconductor substrate 101 and the gate electrodes 105 of a recess shape are formed between the impurity diffusion layers 108.

The gate electrode 105 is formed to protrude above an upper part of the semiconductor substrate 101 by a multi-layered film of a polycrystalline silicon film and a metal film. The polycrystalline silicon film may be formed by including an impurity such as phosphorous when forming a film through a CVD method. As the metal film for the gate electrode, metal having a high melting point such as tungsten (W), tungsten nitride (WN), tungsten silicide (WSi) and the like may be used.

In addition, as shown in FIG. 7, gate insulating films 105a are formed between the gate electrodes 105 and the semiconductor substrate 101. In addition, sides of the gate electrode 105 are formed with sidewalls 105b h an insulating film such as silicon nitride ($Si_3N_4$) and the like. An upper surface of the gate electrode 105 is also formed with an insulating film 105c of silicon nitride, for example, so that the insulating film protects the upper surface.

The impurity diffusion layer 108 is formed by introducing phosphorous, for example, as a n-type impurity, into the semiconductor substrate 101. Substrate contact plugs 109 are formed to contact the impurity diffusion layers 108. The substrate contact plugs 109 are respectively arranged at the positions 205c, 205b, 205c of the substrate contact parts shown in FIG. 6, and are formed polycrystalline silicon containing phosphorous, for example. A horizontal (X) width of the substrate contact plug 109 is formed into a self-aligned structure shape in which the width is defined by the sidewalls 105b provided to the neighboring gate wirings W.

As shown in FIG. 7, a first interlayer insulating film 104 is formed to cover the insulating films 105c on the gate electrodes and the substrate contact plugs 109 and a bit line contact plug 104A is formed to pass through the first interlayer insulating film 104. The bit line contact plug 104A is located at the position of the substrate contact part 205a and is conductively connected to the substrate contact plug 109. The bit line contact plug 104A is formed by depositing tungsten (W) and the like on a barrier film (TiN/Ti) consisting of a stacked film of titanium (Ti) and titanium nitride (TiN). The bit wiring 106 is formed to connect with the bit line contact plug 104A. The bit wiring 106 is made of a stacked film consisting of tungsten nitride (WN) and tungsten (W).

A second interlayer insulating film 107 is formed to cover the bit wiring 106. Capacitor contact plugs 107A are formed to pass through the first interlayer insulating film 104 and the second interlayer insulating film 107 and to connect with the substrate contact plugs 109. The capacitor contact plugs 107A are arranged at the positions of the substrate contact parts 205b, 205c.

A third interlayer insulating film 111 made of silicon nitride and a fourth interlayer insulating film 112 made of silicon oxide are formed above the second interlayer insulating film 107.

Capacitors (Cap) are formed to pass through the third interlayer insulating film 111 and the fourth interlayer insulating film 112 and to connect with the capacitor contact plugs 107A.

The capacitor (Cap) is structured in such a manner that the $TiO_2$ film formed by the invention is sandwiched between a lower electrode 113 and an upper electrode 115 and the lower electrode 113 is conductively connected to the capacitor contact plug 107A.

A fifth interlayer insulating film 120 made of silicon oxide and the like, an upper wiring layer 121 made of aluminum (Al), copper (Cu) and the like and a surface protecting film 122 are formed above the upper electrode 115.

The upper electrode 115 of the capacitor is provided with a predetermined potential, so that it functions as a DRAM device performing an information storing operation by determining whether or not charges kept in the capacitor.

In the followings, a method of forming the capacitor (Cap) will be specifically described.

Figure 8:
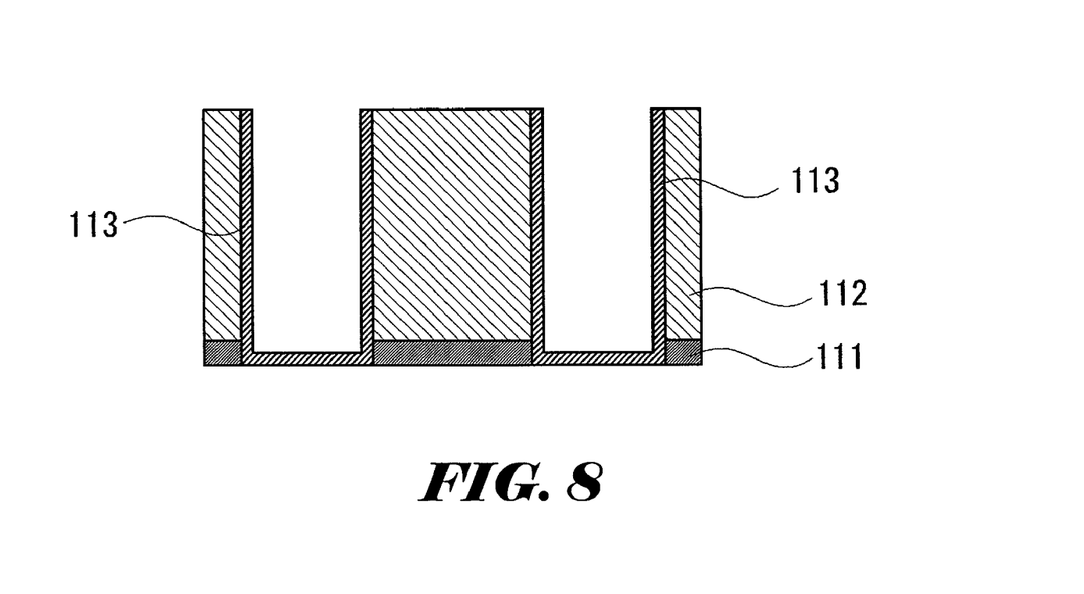
FIG. 8 is a schematic sectional view illustrating a manufacturing process of a capacitor shown in FIG. 7.
Figure 9:
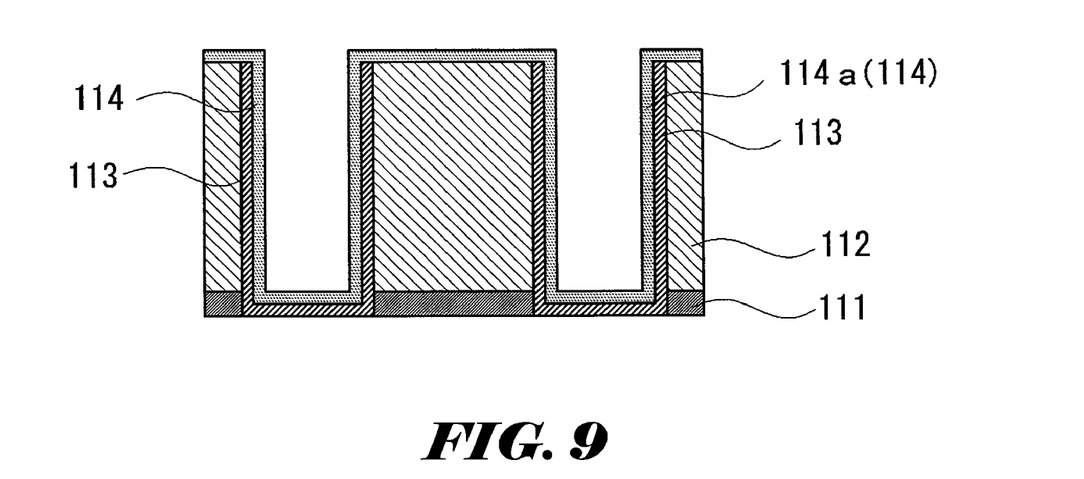
FIG. 9 is a schematic sectional view illustrating a manufacturing process of a capacitor shown in FIG. 7.
Figure 10:
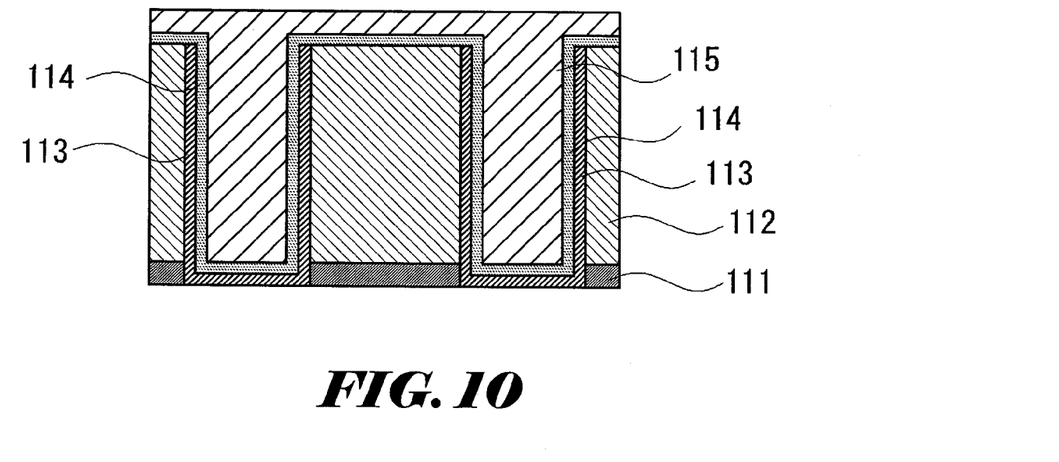
FIG. 10 is a schematic sectional view illustrating a manufacturing process of a capacitor shown in FIG. 7.

FIGS. 8 to 10 are sectional views showing only upper parts from the third interlayer insulating film 111.

First, as shown in FIG. 8, the third interlayer insulating film 111 and the fourth interlayer insulating film 112 are deposited to have a predetermined film thickness. Then, opening holes 112A for forming capacitors are formed with a photolithography technique.

After forming a film of lower electrode material, the lower electrode 113 is formed with dry etching or CMP (Chemical Mechanical Polishing) technique so that it remains only inner walls of the opening holes 112A.

As the material of the lower electrode, it is preferable to use a metal film having strong oxidization resistance. Specifically, ruthenium (Ru), iridium (Ir), platinum (Pt) and the like may be exemplified.

Subsequently, as shown in FIG. 9, a Ti film 114a is deposited to have a thickness of 10 nm or less, for example about 6-8 nm. In the invention, the method of depositing the Ti film is not particularly limited. However, it is preferable to use an ALD method when depositing a Ti film of a uniform thickness in a deep hole, like a capacitor of a DRAM device.

Then, by performing the oxygen annealing at 400° C. for 30 minutes under oxygen environment, the Ti film 114a is converted into a $TiO_2$ film 114. At this time, by forming the third interlayer insulating film 111 with silicon nitride having less oxygen penetration property than silicon oxide for a typical interlayer insulating film, it is possible to prevent the bit line or transistor located below the capacitor from being damaged due to the oxidization.

In addition, the temperature and time of the oxygen annealing may be adjusted so that the Ti film can be completely oxidized, correspondingly to a thickness of a $TiO_2$ film to be desired. The oxygen environment does not necessarily require 100% oxygen. In other words, a mixed environment of inactive gas and oxygen, for example the ambient air may be possible. The environment in which oxygen is sufficient is preferable.

Subsequently, as shown in FIG. 10, a metal film is deposited to cover the surface of the $TiO_2$ film 114 and to fill the opening holes 112A, thereby forming the upper electrode 115. The material of the upper electrode 115 may be different from that of the lower electrode 113. In addition, tungsten (W) or titanium nitride (TiN) and the like having weak oxidization resistance may be used. Thus, the capacitors (Cap) are completed.

By applying the invention, it is possible to form the $TiO_2$ film of a rutile crystal structure having a high dielectric constant at the low temperatures of 400° C. or less.

Accordingly, it is possible to suppress the influence of heat to be applied to a semiconductor element such as transistor that is earlier formed than a capacitor, so that it is possible to form a finer transistor of high performance.

In addition, it is possible to easily form a $TiO_2$ film having a uniform thickness independent from a shape or material of the lower electrode and to increase the capacitance of a capacitor, so that it is possible to easily form a DRAM device of high performance.

In the followings, as an alternative method of manufacturing a capacitor having a $TiO_2$ film using the invention, it will be described a method of continuously implementing the process of depositing a Ti film and the annealing process under oxidative environment in one ALD film forming apparatus.

Figure 11:
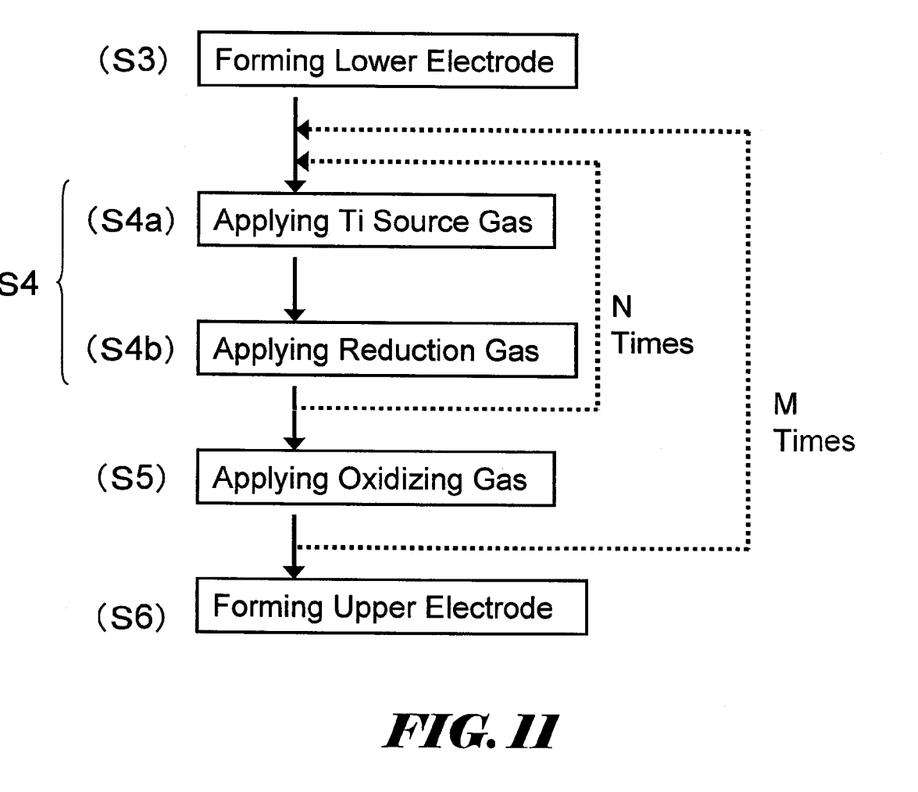
FIG. 11 is a flow chart showing a manufacturing process of a capacitor using the invention.

FIG. 11 is a flow chart showing a process of forming a capacitor.

First, in a step S3, a lower electrode of a capacitor is formed on a semiconductor substrate. As the material of the lower electrode, ruthenium (Ru), iridium (Ir), platinum (Pt) and the like may be used. However, the other metal film having strong oxidization resistance may be used.

Subsequently, the semiconductor substrate having the lower electrode formed thereon is set in a chamber of the ALD apparatus. The ALD apparatus of a sheet type or batch type may be used.

A $TiO_2$ film is formed in the ALD apparatus through the step S4 of depositing a Ti film and the step S5 of oxidizing the deposited Ti film to convert into a $TiO_2$ film of a rutile crystal structure.

The step S4 of depositing a Ti film comprises the step S4a of supplying Ti source gas (precursor) and the step S4b of supplying reduction gas.

Figure 12:
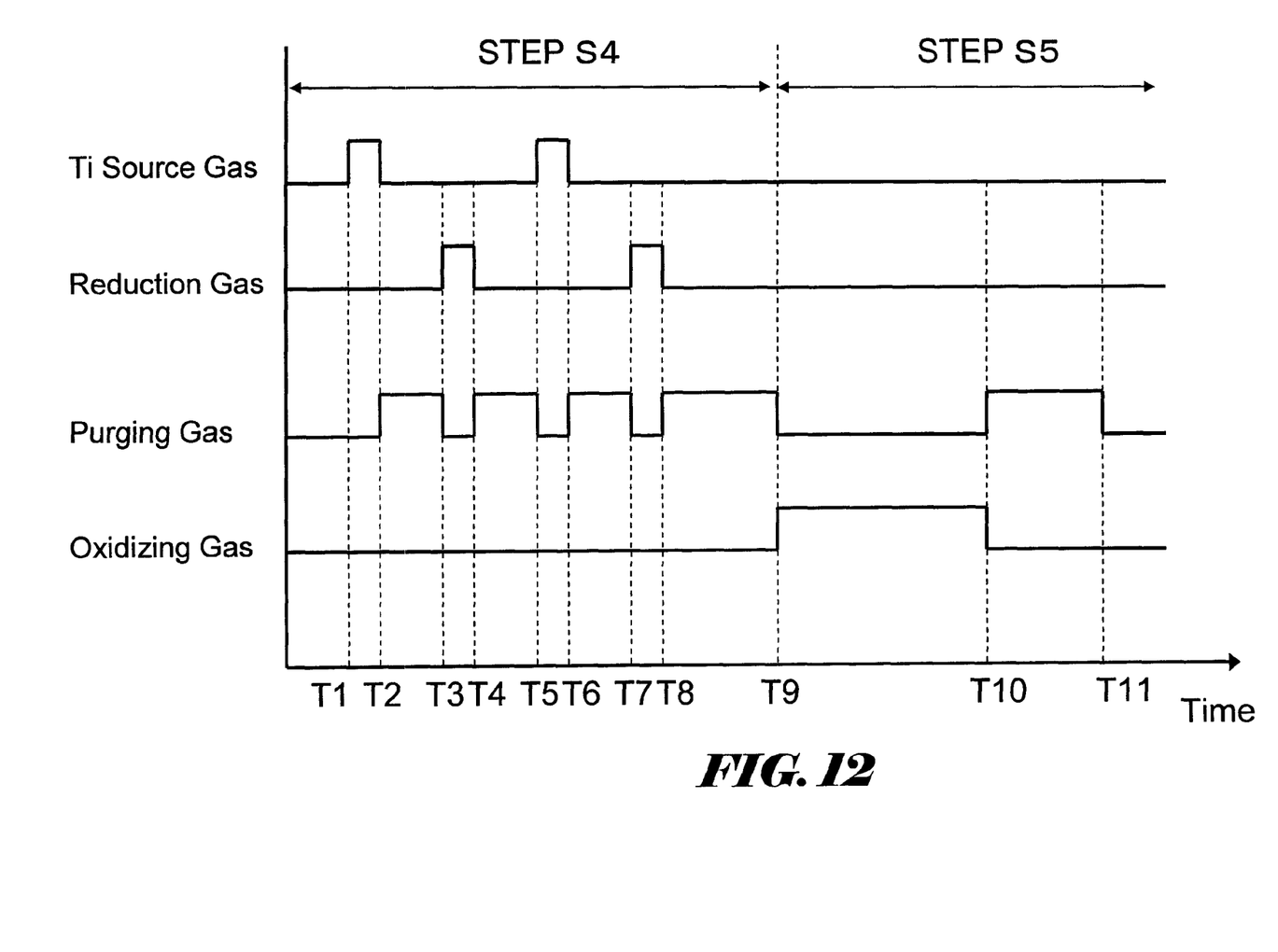
FIG. 12 is a timing chart showing a method of supplying a plurality of gases in the manufacturing process of the capacitor shown in FIG. 11.

FIG. 12 is a timing chart of a plurality of gases to be supplied to the ALD apparatus.

In this exemplary embodiment, four types of gases, i.e., Ti source gas, reduction gas, purging gas and oxidizing gas are supplied into the chamber in accordance with the timing shown in FIG. 12.

The steps S4 and S5 will be described with reference to FIG. 12.

The temperature of the semiconductor substrate in the chamber is set at 400° C.

As the Ti source gas, $TiCl_4$ may be exemplified. In addition, the Ti source gas is not particularly limited as long as Ti and oxygen are not directly combined.

First, in the step S4, the Ti source gas is supplied into the chamber for 1-5 seconds at time T1 and adsorbed into the surface of the lower electrode. Then, at time T2, the supply of the Ti source gas is stopped and the purging gas is supplied into the chamber for 5-30 seconds. As the purging gas, nitrogen ($N_2$) may be exemplified. By supplying the purging gas, the Ti source gas, which remains without being adsorbed into the surface of the lower electrode, is discharged to the outside of the chamber.

Subsequently, at time T3, the supply of the purging gas is stopped and the reduction gas is supplied into the chamber for 2-5 seconds in the step S4b. As the reduction gas, hydrogen ($H_2$) may be exemplified. The reduction gas is activated through a plasma generator provided in the ALD apparatus so as to accelerate the reaction with the Ti source adsorbed.

Then, at time T4, the supply of the reduction gas is stopped and the purging gas is supplied into the chamber for 5-30 seconds. Through the above processes, a Ti film of a level of an atomic layer is formed on the surface of the lower electrode. By setting the temperature of the semiconductor substrate at 200° C. or more (400° C. in this exemplary embodiment), it is possible to form a crystallized Ti film. By repeating the series of processes (cycle) by N times (N: positive integer), it is possible to form a Ti film having a desired film thickness. In this exemplary embodiment, the cycle was repeated 30 times, so that a Ti film having a thickness of about 2.4 nm was obtained. In the meantime, FIG. 12 shows two cycles (time T5-T9) as the step S4.

After forming the Ti film having a predetermined thickness, the oxidizing gas is supplied into the chamber for 1-2 minutes in the step S5. As the oxidizing gas, ozone ($O_3$) may be used. By supplying the oxidizing gas, the Ti film is completely oxidized and converted into a rutile-type $TiO_2$ film. In this exemplary embodiment, the $TiO_2$ film having a thickness of about 3.4 nm was obtained by the oxidization. By repeating the step S4 and the step S5 (steps S4 and S5 constitute one cycle) M times (M: positive integer), it is possible to form a rutile-type $TiO_2$ film having a desired film thickness. In this exemplary embodiment, the cycle was repeated 3 times (N=30, M=3), so that a $TiO_2$ film having a thickness of about 10 nm was obtained.

In the prior art (Gyeong Teak Lim et al.), when forming a $TiO_2$ film with the ALD apparatus, under low temperatures of 210° C. or less, the oxidizing gas ($H_2O$) is supplied just after supplying TDMAT gas, which is Ti source gas, so that an amorphous $TiO_2$ film of a level of an atomic layer is formed. Then, by repeating the deposition of the $TiO_2$ film of a level of an atomic layer, the amorphous $TiO_2$ film is made to have a predetermined thickness. As described above, even when the amorphous $TiO_2$ film is crystallized through the annealing, it is difficult to make a rutile-type $TiO_2$ film.

In contrast, according to the invention, the substrate is maintained at the temperatures higher than that of the prior art and the reduction gas is supplied just after supplying the Ti source gas, so that a crystalline Ti film of a level of an atomic layer is formed. Then, by repeating the process of forming the Ti film of a level of an atomic level, the crystalline Ti film is made to have a predetermined thickness and then the oxidizing gas is supplied to oxidize the Ti film, so that a $TiO_2$ film of a rutile crystal structure is obtained.

Then, when forming an upper electrode on the $TiO_2$ film in the step S6, a capacitor device is completed. The material of the upper electrode may be different from that of the lower electrode.

Like this, by continuously implementing the process of depositing a Ti film and the annealing process under oxidative environment in one ALD film forming apparatus, it is possible to easily form a rutile-type $TiO_2$ film.

When the above capacitor for the DRAM device is formed by the above method, it is possible to form a DRAM device of high performance more easily.

What is claimed is:

1. A method of manufacturing a semiconductor device having a capacitor, the method comprising:
   forming a lower electrode of a capacitor,
   depositing a Ti film on the lower electrode,
   annealing the Ti film under oxidative environment, thereby converting the Ti film into a $TiO_2$ film having a rutile crystal structure,
   forming an upper electrode of the capacitor on the $TiO_2$ film, wherein the capacitor is connected to a semiconductor element to be formed on a semiconductor substrate through a contact plug, and
   forming at least one interlayer insulating film having less susceptibility to oxygen penetration than another interlayer insulating film between the capacitor and the semiconductor element before forming the capacitor.

2. The method according to claim 1, wherein the annealing is performed at temperatures of 350° C.-400° C.

3. The method according to claim 1, wherein the oxidative environment is a gas environment containing oxygen gas.

4. The method according to claim 1, wherein the Ti film is deposited to be crystalline on the lower electrode.

5. The method according to claim 1, wherein the Ti film is deposited to be crystalline on the lower electrode by an ALD apparatus, and wherein the annealing is continuously performed in the ALD apparatus.

6. The method according to claim 1, wherein the lower electrode is made of an oxidation-resistant metal material.

7. The method according to claim 1, wherein said Ti film is formed on a non-oxidized surface of said lower electrode of said capacitor.

8. A method of manufacturing a semiconductor device comprising:
   forming a lower electrode of a capacitor on a semiconductor substrate;
   setting the semiconductor substrate having the lower electrode in a chamber of an ALD apparatus;
   supplying Ti source gas into the chamber;
   supplying reduction gas into the chamber;
   repeating the processes of supplying Ti source gas and reduction gas alternately in several times, thereby depositing a crystalline Ti film on the lower electrode;
   supplying oxidizing gas into the chamber to perform annealing of the Ti film, thereby forming a $TiO_2$ film having a rutile crystal structure on the lower electrode;
   taking out the semiconductor substrate having the $TiO_2$ film formed from the chamber; and
   forming an upper electrode opposite to the lower electrode by intervening the $TiO_2$ film therebetween.

9. The method according to claim 8, wherein the Ti film is deposited to be crystalline by an ALD apparatus, and wherein the annealing is continuously performed in the ALD apparatus.

10. The method according to claim 8, wherein the lower electrode is made of an oxidation-resistant metal material.

11. The method according to claim 8, wherein the capacitor is connected to a semiconductor element to be formed on a semiconductor substrate through a contact plug, and further comprising the process of forming at least one interlayer insulating film having less susceptibility to oxygen penetration than another interlayer insulating film between the capacitor and the semiconductor element before forming the capacitor.

12. The method according to claim 8, wherein said Ti film is formed on a non-oxidized surface of said lower electrode of said capacitor.

* * * * *